United States Patent
Robertson et al.

(10) Patent No.: US 10,024,922 B2
(45) Date of Patent: Jul. 17, 2018

(54) METHOD AND STRATEGY FOR MULTIPLEXING BATTERY CYCLER HARDWARE

(71) Applicant: UCHICAGO ARGONNE, LLC., Chicago, IL (US)

(72) Inventors: David C. Robertson, Chicago, IL (US); Panagiotis D. Prezas, Chicago, IL (US); Lee K. Walker, Lisle, IL (US)

(73) Assignee: UChicago Argonne, LLC, Chicago, IL (US)

( * ) Notice: Subject to any disclaimer, the term of this patent is extended or adjusted under 35 U.S.C. 154(b) by 1019 days.

(21) Appl. No.: 14/297,860

(22) Filed: Jun. 6, 2014

(65) Prior Publication Data

US 2015/0357139 A1    Dec. 10, 2015

(51) Int. Cl.
*G01R 31/36* (2006.01)
*G01R 31/26* (2014.01)

(52) U.S. Cl.
CPC ..... *G01R 31/3631* (2013.01); *G01R 31/2608* (2013.01); *G01R 31/2621* (2013.01); *G01R 31/2607* (2013.01); *Y10T 307/76* (2015.04)

(58) Field of Classification Search
CPC ............ G01R 31/3631; G01R 31/2608; G01R 31/2621; G01R 31/2607
USPC .......................... 320/125; 324/244, 429, 430
See application file for complete search history.

(56) References Cited

U.S. PATENT DOCUMENTS

| | | | |
|---|---|---|---|
| 6,249,125 B1 | 6/2001 | Haddad et al. | |
| 2002/0008523 A1* | 1/2002 | Kiang | G01R 31/3631 324/429 |
| 2012/0162839 A1* | 6/2012 | Wiederhold | G01R 31/3631 361/65 |
| 2013/0294252 A1* | 11/2013 | Olgaard | H04L 43/12 370/241 |

* cited by examiner

*Primary Examiner* — Hal Kaplan
*Assistant Examiner* — Thai Tran
(74) *Attorney, Agent, or Firm* — Foley & Lardner LLP

(57) ABSTRACT

A method and apparatus for receiving a selection of a first device under test. Connecting the first device under test to a load based at least on a closed high-side driver relay and a closed low-side driver relay for a first switch, from a plurality of devices under test. Closing at a first rate a high-side driver relay of a first switch based at least on the received selection. Closing at a second rate a low-side driver relay of the first switch based at least on the received selection, wherein the first rate and second rate are different.

16 Claims, 13 Drawing Sheets

METHOD AND STRATEGY FOR MULTIPLEXING BATTERY CYCLER HARDWARE

STATEMENT OF GOVERNMENT INTEREST

The United States Government has rights in this invention pursuant to Contract No. DE-AC02-06CH11357 between the United States Government and the UChicago Argonne, LLC, representing Argonne National Laboratory.

FIELD OF THE INVENTION

This invention relates to a method of multiplexing battery cycler hardware. More specifically, this invention relates to novel multiplexing strategies for improving utilization of battery cycler hardware.

BACKGROUND OF THE INVENTION

This section is intended to provide a background or context to the invention that is, inter alia, recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Battery cycling hardware is expensive hardware that has long lead times. Because battery testing can lead to long wait times, there is a need to share battery cycler hardware channels across multiple test batteries. Existing methods for sharing battery cycler hardware include manual operation of the battery cycler hardware involving disconnecting one battery and connecting another. However, manual operation of the battery cycler requires operators to switch the batteries at specific times.

SUMMARY

The present invention addresses these problems and provides processes for automating switching to different test channels. In some embodiments methods for receiving a selection of a first device under test are presented. Connecting the first device under test to a load based at least on a closed high-side driver relay and a closed low-side driver relay for a first switch, from a plurality of devices under test. Closing at a first rate a high-side driver relay of a first switch based at least on the received selection. Closing at a second rate a low-side driver relay of the first switch based at least on the received selection, wherein the first rate and second rate are different. The load and power supply be a cycler or be separate components.

In other embodiments, apparatus comprising a power supply, a load, and a plurality of switches is presented. Each switch in the apparatus comprising a high-side driver and a low side-driver, wherein the load and plurality of switches are part of a plurality of circuits. A first switch in the plurality of switches corresponds to a first circuit in the plurality of circuits, wherein the first switch is closed when the high-side driver relay and the low-side driver relay of the first switch are closed, wherein the high-side driver relay of the first switch is closed at a first rate based on a selection of the first circuit, wherein the low-side driver relay of the first switch is closed at a second rate based at least on the selection of the first circuit, wherein the first and second rates are different. The first circuit is completed based at least on the first switch being closed.

These and other advantages and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF EMBODIMENTS

In certain embodiments, the present invention provides improved methods for a single cycler setup to control and monitor multiple devices under test (DUT) through manual or automated switching between DUTs. The disclosed cycler multiplexes cycler channels using automated hardware systems with hardware or software control so that only one DUT is connected to the cycler. Additionally, the cycler can include hardware safety logic to prevent DUTs from interfering with one another. For example, if multiple DUTs attempt to connect, the hardware safety logic can disconnect all DUTs from the cycler. A DUT can be any electronic device including, but not limited to a battery or transistor.

Figure 1:
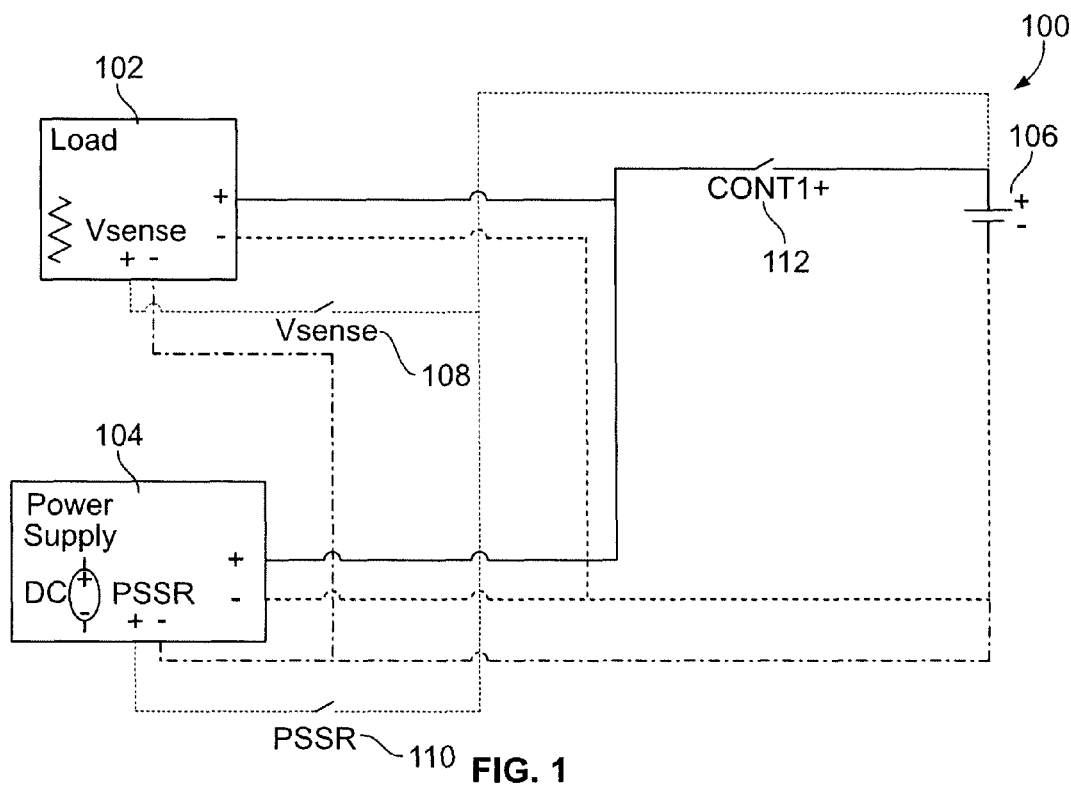
FIG. 1 is a schematic showing a single relay channel in an illustrative embodiment.

FIG. 1 is a schematic showing a single channel relay configuration in an illustrative embodiment. The single channel relay 100 connects a load and a power supply 104 to a DUT 106. Power is supplied to the DUT 106 by closing connector relay 112 and $V_{sense}$ relay 108. PSSR relay 110 can be operated to control a voltage sense connection to the power supply 104. In another embodiment, the single channel relay 100 connects a cycler (not shown) functioning as both the load and the power supply to a DUT (106).

Figure 3:
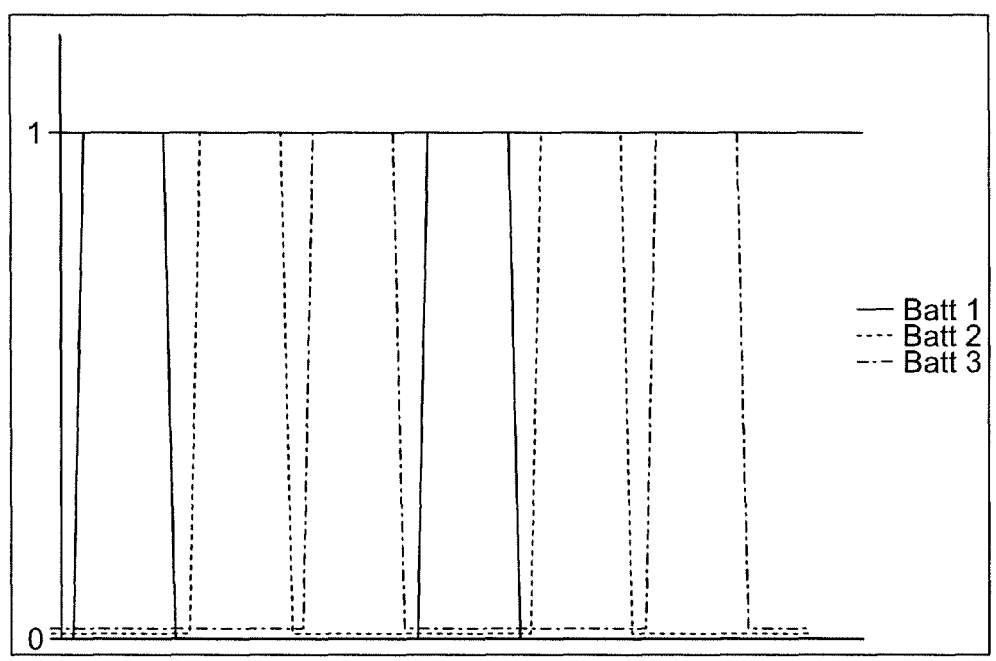
FIG. 3 is a control timing chart in an illustrative embodiment.
Figure 2:
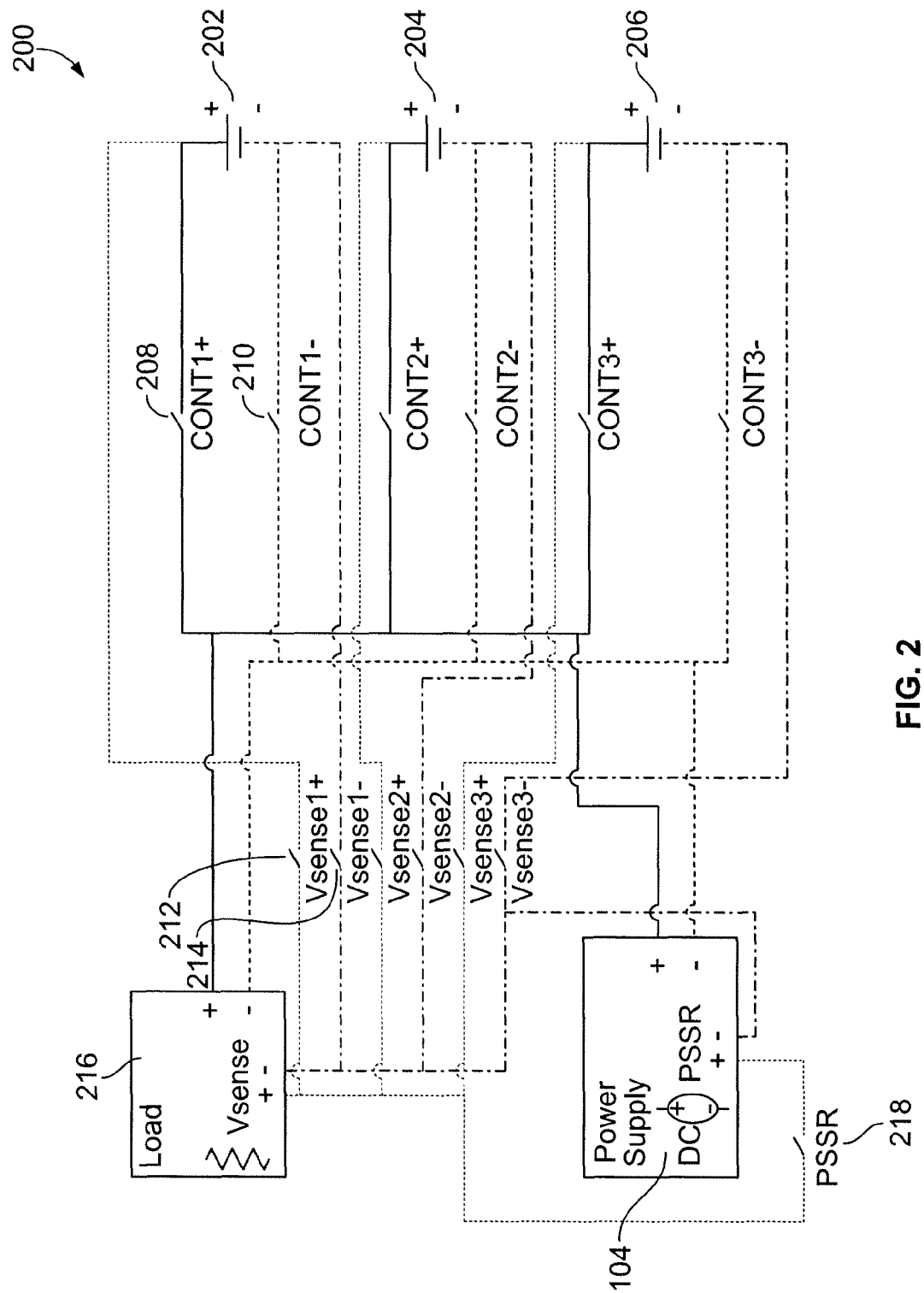
FIG. 2 shows a three to one cell multiplexed relay channel in an illustrative embodiment.

The single channel relay 100 of FIG. 1 can be expanded to a control multiple DUTs. With reference to FIG. 2, a three to one cell multiplexed relay channel is illustrated. Multiplexed relay channel 200 connects DUTs 202, 204, 206 to load 216 and power supply 104. Each DUT is connected to load 216 via switches. For Example, DUT 202 can be connected by contactor switches (e.g., cont1+ 208 and cont1− 210) and $V_{sense}$ switches (e.g., $V_{sense}$1+ 212, and $V_{sense}$1− 214). The power to the multiplexed channel can be controlled by a pssr switch 218. The multiplexed relay channel 200 can operate so that only a single DUT is receiving power at any given time. For example, FIG. 3 illustrates a control timing chart for the multiplexed relay channel 200 where only one DUT is active at any given time.

Figure 4:
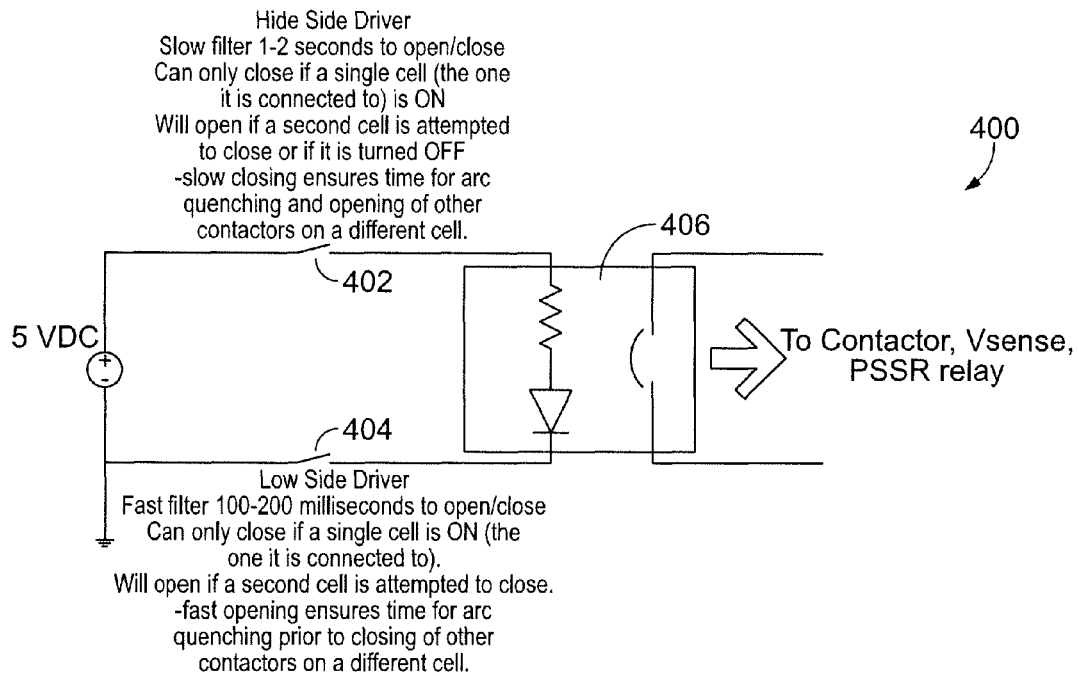
FIG. 4 is a schematic of a dual drive relay in an illustrative embodiment.
Figure 5A:
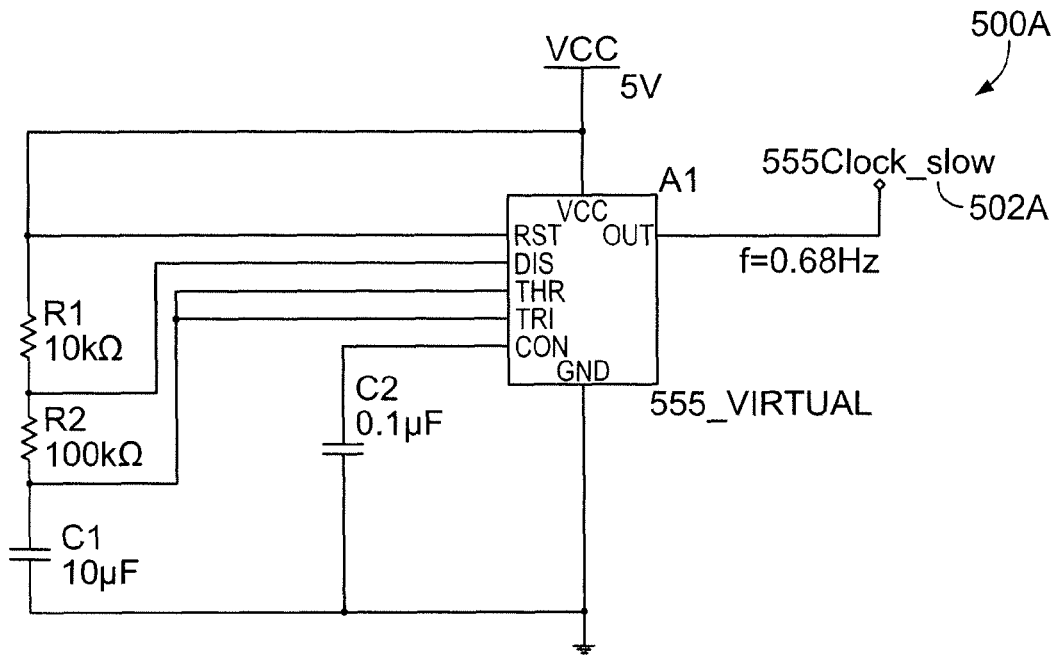
FIGS. 5A and 5B are schematics of a slow-filter clock and a fast-filter clock in an illustrative embodiment.
Figure 5B:
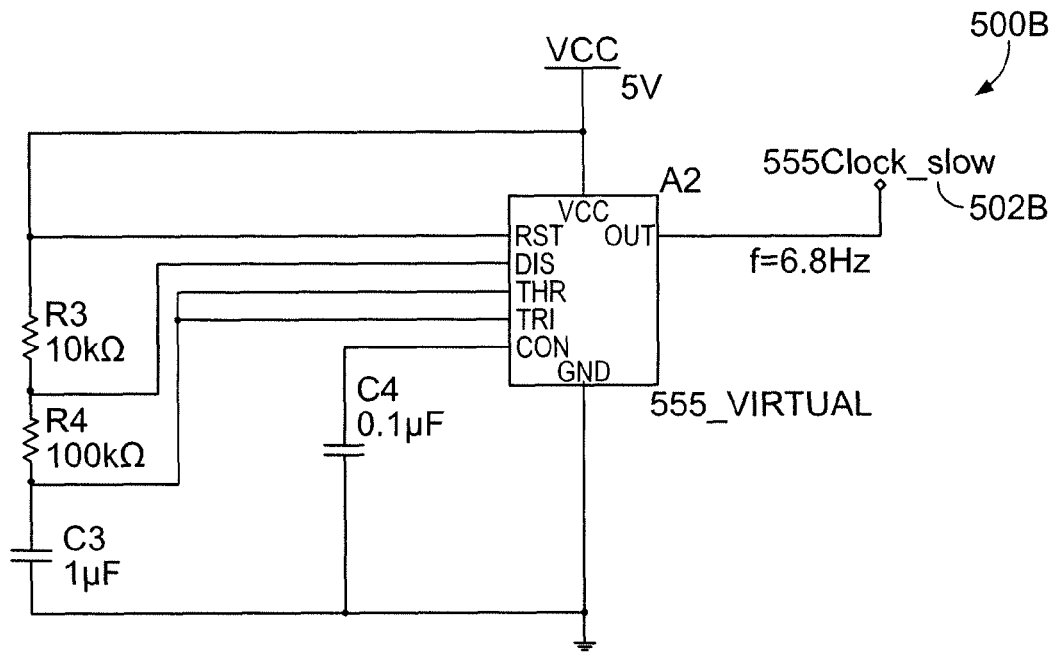

In an embodiment, each contactor switch can be controlled by a dual drive relay. Referring to FIG. 4, a schematic of a switch controlled by a dual drive relay is illustrated. Dual drive relay 400 includes a high-side driver 402 relay and a low-side driver 404 relay. Switch 406 can be closed when both the high-side driver 402 relay and the low-side driver 404 relay are closed. High-side driver 402 relay can operate at a slower speed than the low-side driver 404 relay. The open and close speed of each relay can be controlled based on a clock signal input. For example, high-side driver 402 can receive a clock signal from a slow-filter clock (see, for example, clock 500A illustrated in FIG. 5A) and low-side driver 404 can receive a clock signal from a fast-filter clock (see, for example, clock 500B illustrated in FIG. 5B). With reference to FIG. 5A, slow-filter clock 500A has a frequency of 0.68 Hz causing the high-side driver 402 to have an open/close time of one to two seconds. With reference to FIG. 5B, fast-filter clock 500B has a frequency of 6.80 Hz, causing the low-side driver 404 to have an open/close time of one hundred to two hundred milliseconds. It will be appreciated by one skilled in the art that different open/close times can be achieved for each driver by, for example, altering the frequency of each respective clock.

Figure 6:
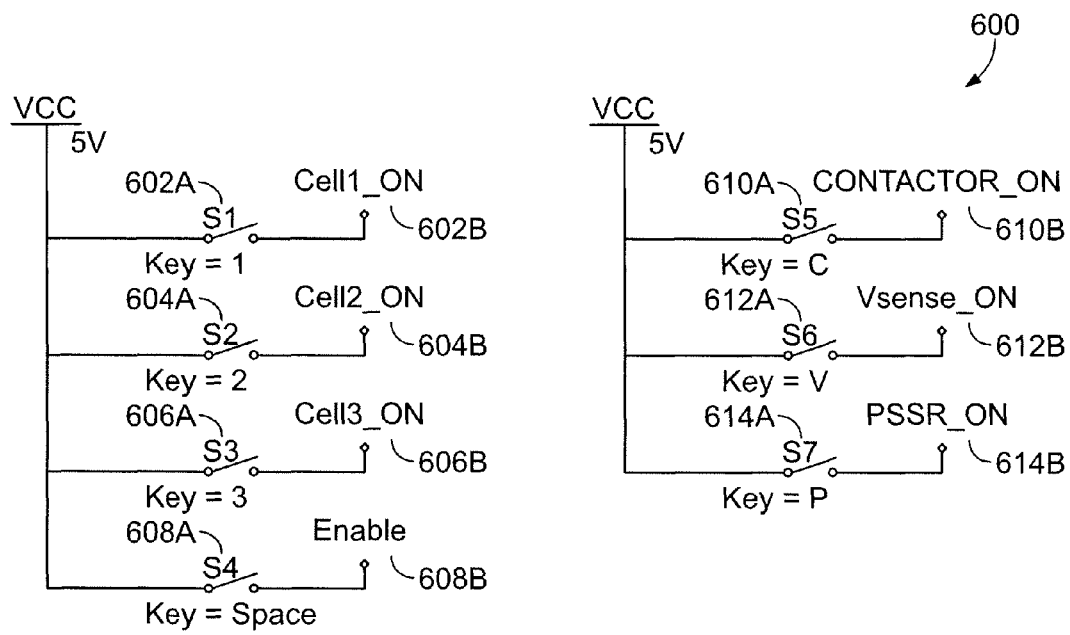
FIG. 6 is a schematic of input signals for controlling the operation of the multiplexed relay channel in an illustrative embodiment.

The multiplexed relay channel 200 can be managed by controlling input signals to the multiplexed relay channel 200. FIG. 6 is a schematic of input signals for controlling the operation of the multiplexed relay channel 200. In an embodiment, the multiplexed relay channel 200 can receive, as input, signals for selecting a DUT and for selecting a state of the multiplexed relay channel 200. For example, the input signals 600 can include signals for selecting a DUT 602B, 604B, 606B. Additional or fewer DUT selection signals can be received based on, for example, the number of DUTs that can be connected to the multiplexed relay channel 200. The input signals 600 can further include signals for controlling the operation of the multiplexed relay channel 200. For example, the input signals 600 can include signals to enable the multiplexed relay channel 200 (e.g., enable signal 608B), enable contactor switches (e.g., contactor_on 610B), enable $V_{sense}$ switches (e.g., $V_{sense}$_on 612B), and control power (e.g., pssr_on 614B) to the multiplexed relay channel 200. The input signals can be turned on or off by closing or opening switches associated with each input signal. For example, switches 602A, 604A, 606A, 608A, 610A, 612A, 614A each control one of the input signals illustrated in FIG. 6. Each input signal can have a default state (e.g., input switch 602A can have a default state of open and input switch 608A can have a default state of closed). Each individual switch can be manually or automatically toggled (not shown). For example, switch 602A can be toggled when the number '1' is pressed on a keyboard (not shown) in communication with switch 602A. In a further example, switch 602A can be toggled programmatically by execution of software by a processing system or by execution of hardware logic. In a further embodiment, inputs switches can be controlled by manual selection, automatic selection, or both.

Figure 7:
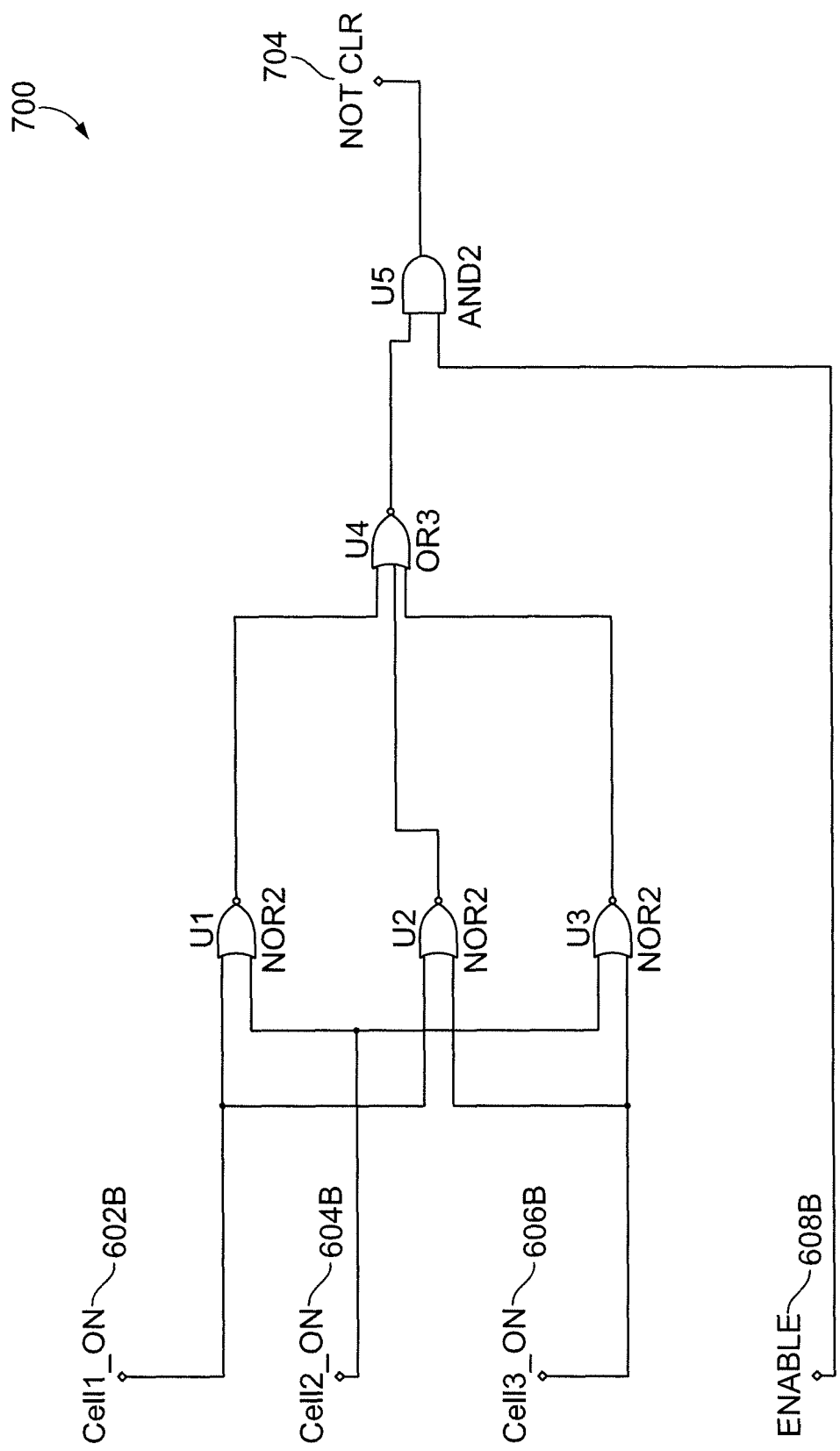
FIG. 7 is a schematic of safety logic for controlling operation of the multiplexed relay channel in an illustrative embodiment.

The multiplexed relay channel 200 can ensure that only one DUT is connected to load 216. With reference to FIG. 7, a schematic of safety logic for controlling operation of the multiplexed relay channel is illustrated. The safety logic 700 can generate a not_clr signal 704 to disconnect all DUTs 202, 204, 206 from the load 216. In an embodiment, the safety logic 700 receives, as input, DUT selection signals 602B, 604B, 606B. The safety logic 700 can detect if more than one DUT selection signal 602B, 604B, 606B is active. It will be appreciated by one skilled in the art that the safety selection logic 700 can be modified to support additional or fewer DUT selection signals. In a further embodiment, the safety selection logic 700 can receive an enable signal 608B. The enable signal 608B can disconnect all DUTs 202, 204, 206 from the load 216 without relying on DUT selection signals 602B, 604B, 606B.

Figure 8A:
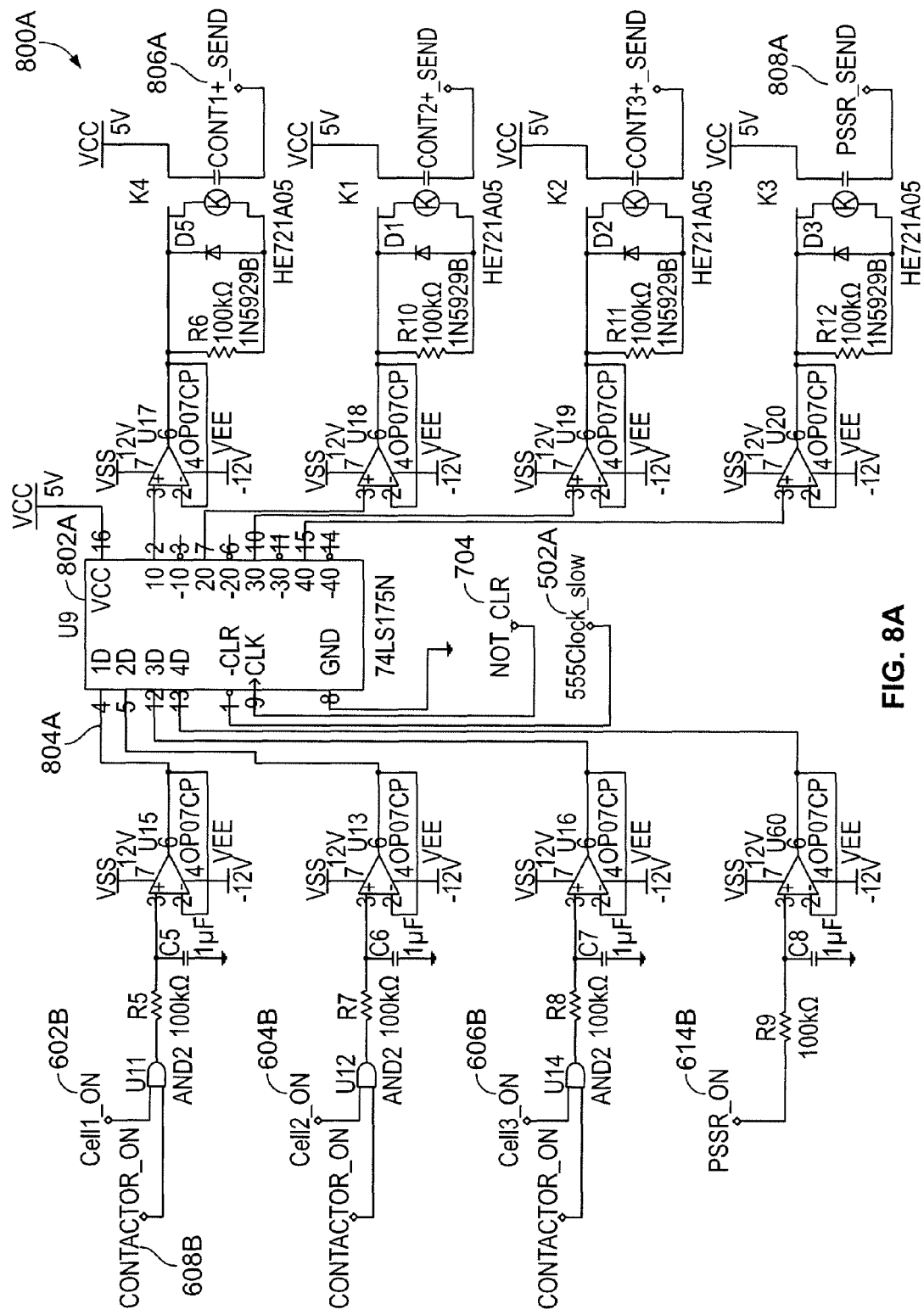
FIGS. 8A-8D are schematics of drive controllers for controlling contactor switches to different DUTs.

FIG. 8A is a schematic of a drive controller 800A for controlling a high-side driver 402 relay of a positive side of multiple contactor switches. A flip-flop 802A can be used as a trigger latch to open or close a high-side driver 402 relay for one or more contactor switches (e.g., positive side of contactor switch 208). In an embodiment, the flip-flop 802A receives an input signal 804A. The input signal 804A can be based on, but not limited to, DUT selection signal 602B and contactor_on signal 608B. For example, the 804A signal can be a high signal when both DUT selection signal 602B and contactor_on signal 608B are in a high state. The flip-flop can output a signal that can generate a cont1+_send signal 806A. The flip-flop output signal can be updated, for example, with each positive-going pulse of clock signal 502A. The flip-flop 802A can also receive the not_clr signal 704. In an embodiment, the not_clr signal 704 can cause all outputs (e.g., cont1+_send 806A) to open the high-side driver 402 relay to which the signal is transmitted to. In a further embodiment, the flip-flop 802A can control additional types of switches. For example, flip-flop 802A receives as input the pssr_on signal 614B and outputs a pssr_send 808A signal, based on, but not limited to, the pssr_on signal 614B, a psser_send 808A signal. The pssr_send 808A signal can be used to control, for example, but not limited to, the high-side driver 402 relay of the pssr switch 218.

Figure 8B:
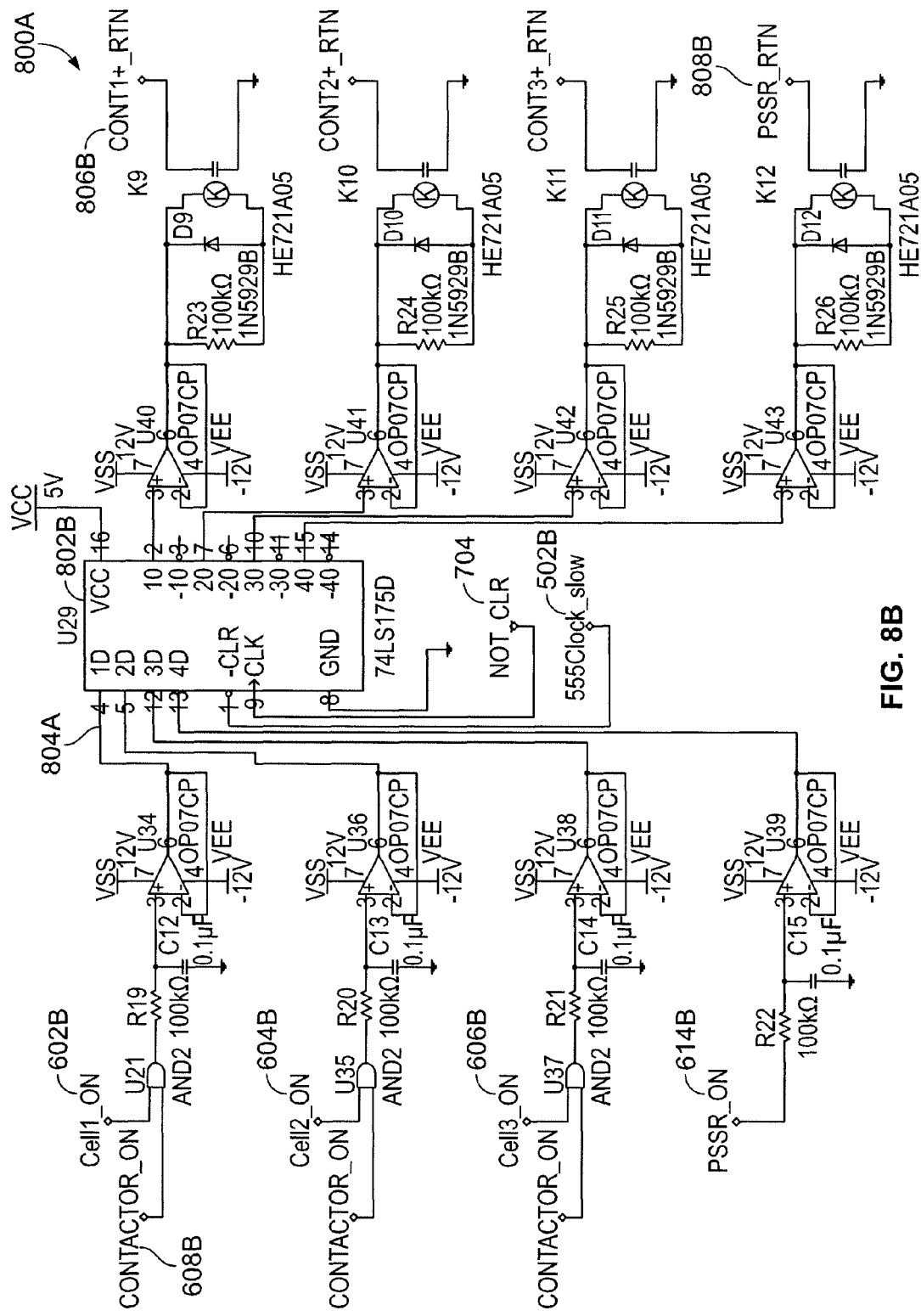

FIG. 8B is a schematic of a drive controller 800A for controlling a low-side driver 404 relay of a negative side of multiple contactor switches. A flip-flop 802B can be used as a trigger latch to open or close a low-side driver 404 relay for one or more contactor switches (e.g., negative side of contactor switch 208). In an embodiment, the flip-flop 802B receives the input signal 804A. The output signal 806B can be updated, for example, with each positive-going pulse of clock signal 502B. The flip-flop 802B can also receive the not_clr signal 704. In an embodiment, the not_clr signal 704 can cause all outputs (e.g., cont1+_rtn 806B) to open the low-side driver 404 relay. In a further embodiment, the flip-flop 802B can control additional types of switches. For example, flip-flop 802B receives as input the pssr_on signal 614B and outputs a pssr_rtn signal 808B, based on, but not limited to, the pssr_on signal 614B. The pssr_rtn 808B signal can be used to control, for example, but not limited to, the low-side driver 404 relay of the pssr switch 218.

In an embodiment, the flip-flop 802A is connected to slow-filter clock 500A and flip-flop 802B is connected to fast-filter clock 500B. Thus, the high-side driver 400 relays that receive signals based on flip-flop 802A can close more slowly than the low-side driver 404 relays that receive signals based on flip-flop 802B. The difference in the speed of opening and closing can allow sufficient time for arc quenching and opening of other contactors on different cells. The frequency of clocks 500A and 500B can be adjusted to allow for faster or slower opening and closing times for high-side driver 402 relays and low-side driver 404 relays. For example, the difference in the respective speed of operation of the high-side driver 402 and low-side driver 404 can be reduced to decrease the time permitted for arc quenching. In another example, the difference in the respective speed of operation of the high-side driver 402 and low-side driver 404 can be increased to extend the time permitted for arc quenching. In a further example, the difference in the respective speed of operation of the high-side driver 402 and the low-side driver 404 can be adjusted based on the contactor switch used, the desired speed of switching, or both.

Figure 8C:
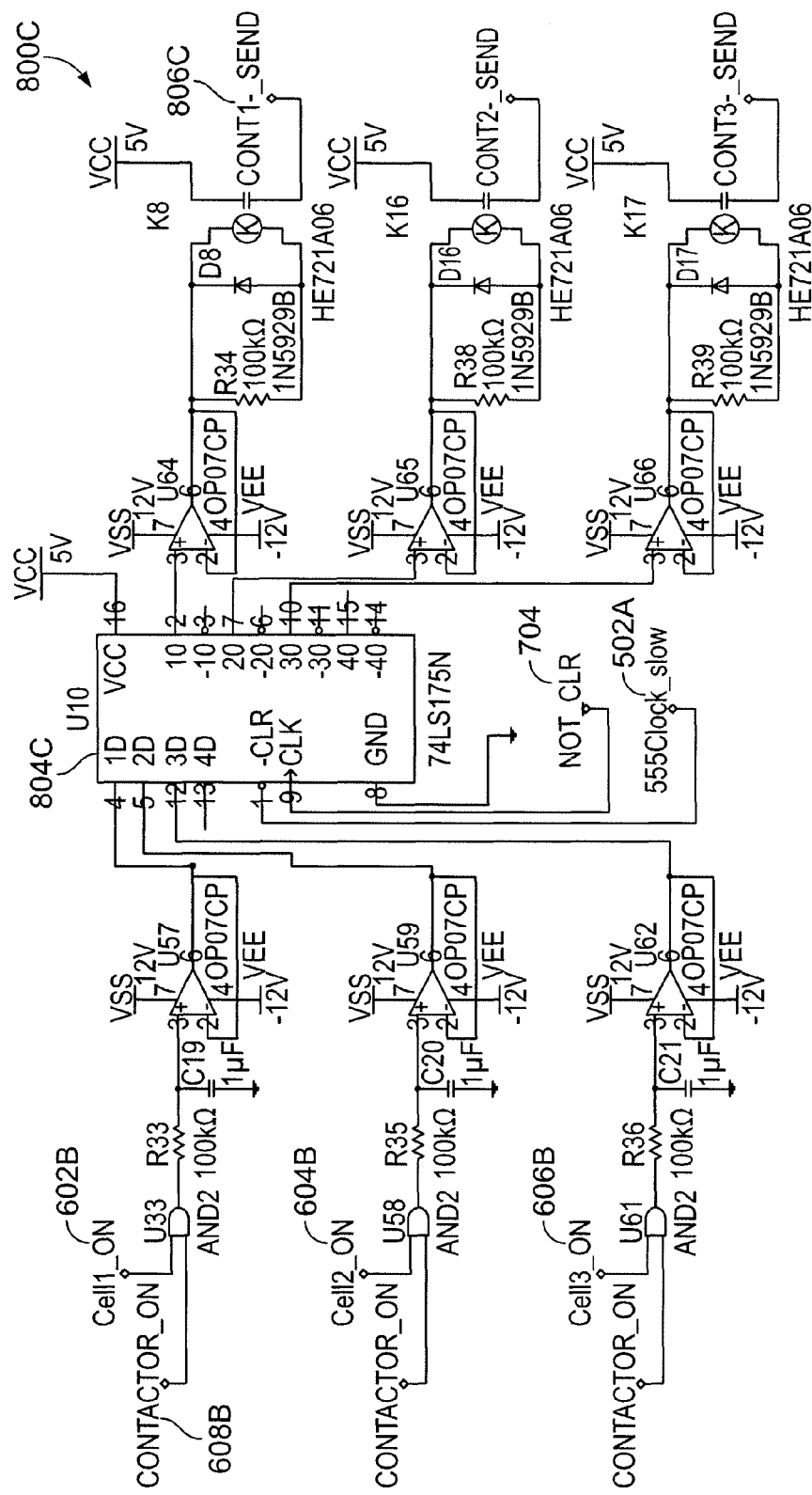
Figure 8D:
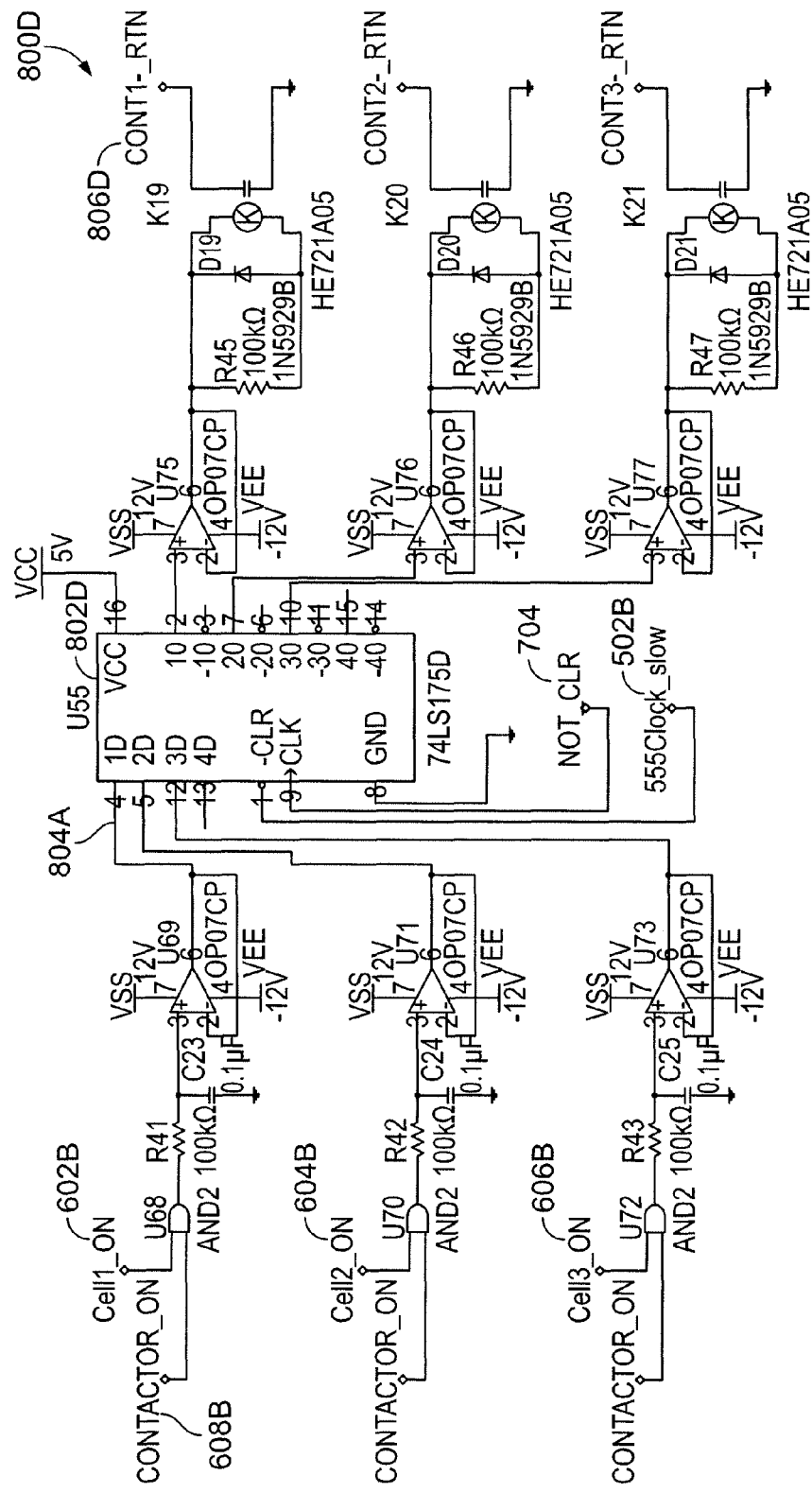
Figure 9A:
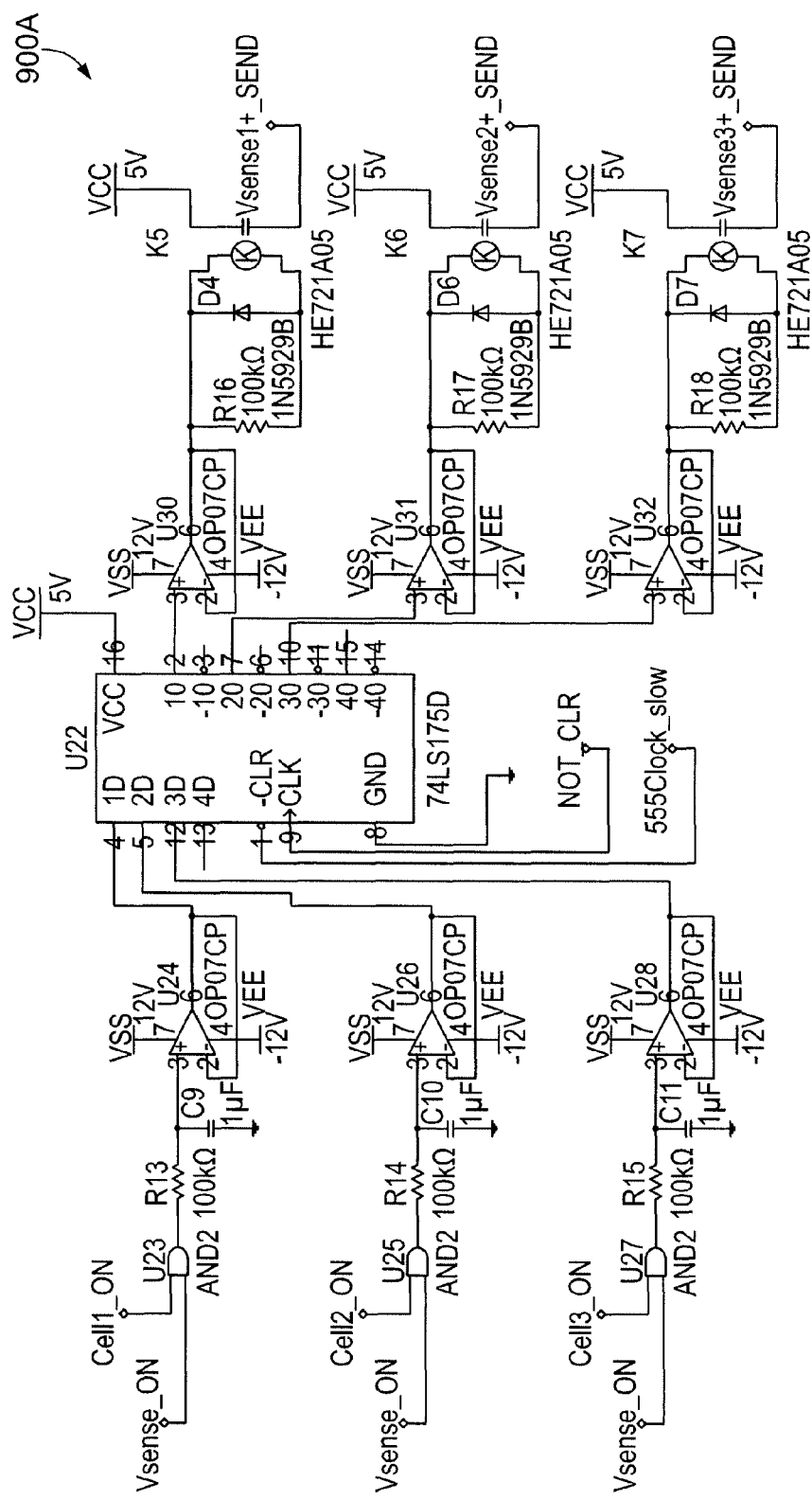
FIGS. 9A-9D are schematics of drive controllers for controlling $V_{sense}$ switches to different DUTs.
Figure 9B:
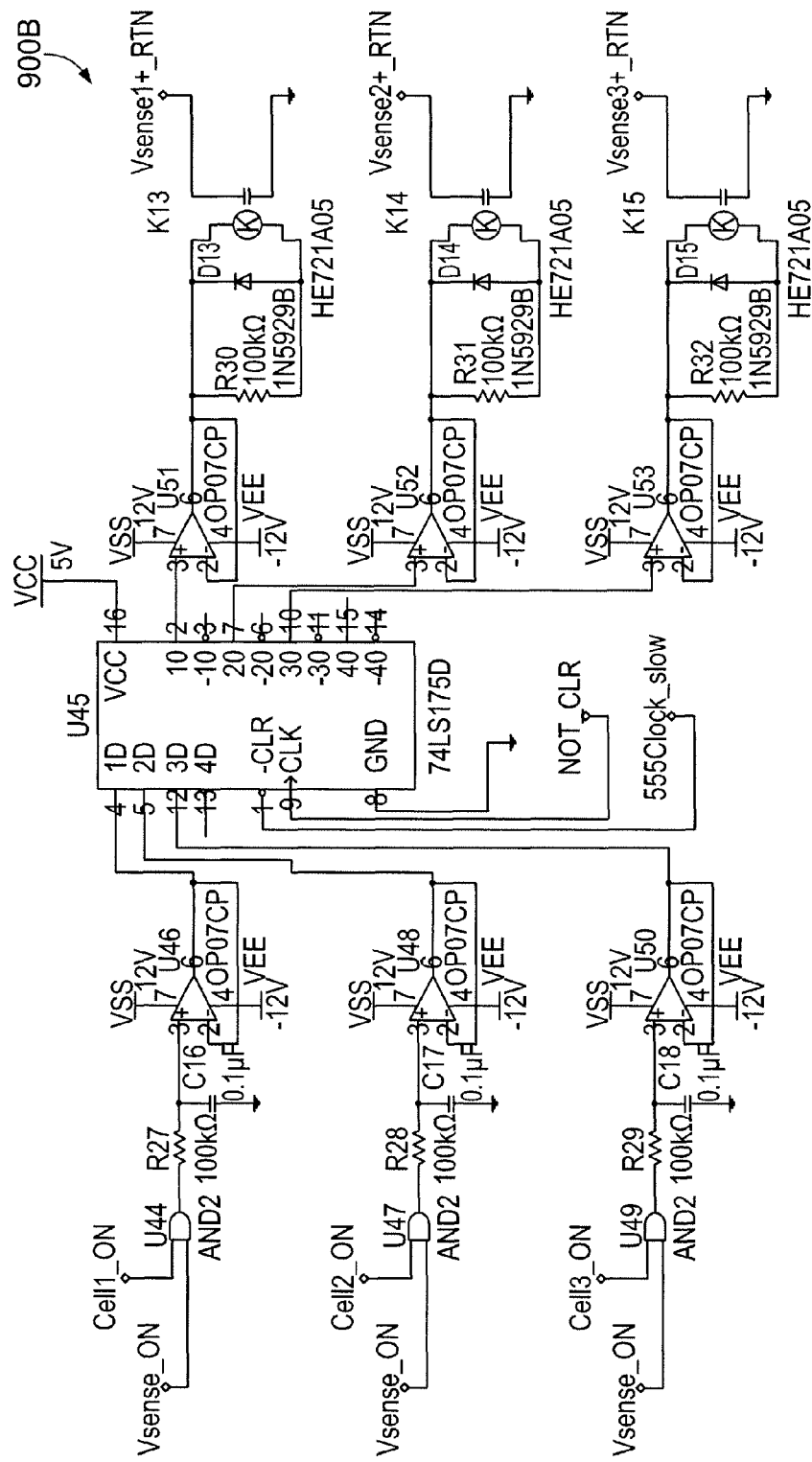
Figure 9C:
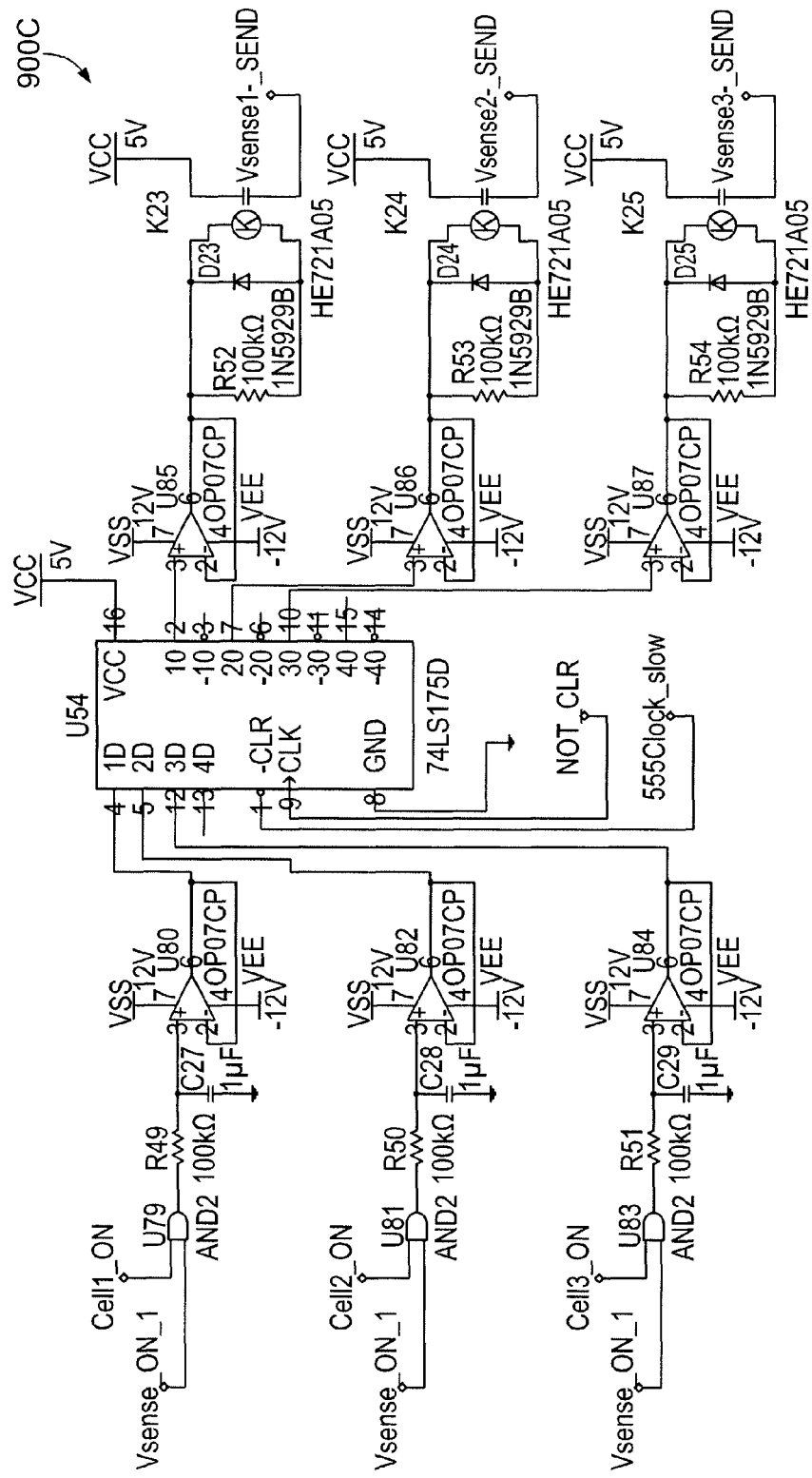
Figure 9D:
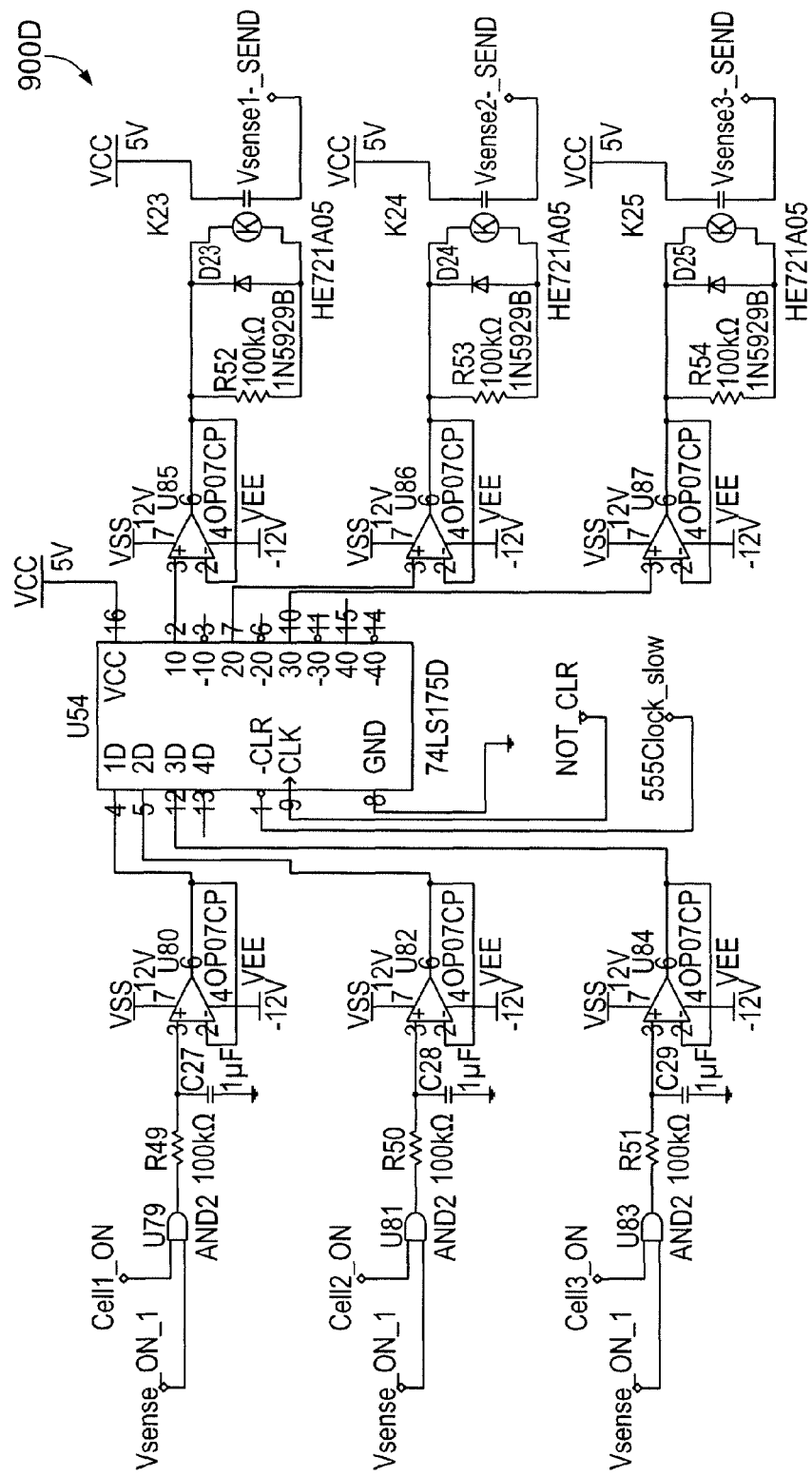

In an embodiment, the multiplexed relay channel can include contactor switches on a return line from a DUT. For example, multiplexed relay channel 200 includes the cont1-switch 210 on the return line from DUT 202. Referring to FIGS. 8C and 8D, schematics of drive controllers 800C and 800D for controlling the high-side driver 402 and low-side driver 404 relays of contactor switches on a return line are illustrated. In a further embodiment, the multiplexed relay channel can include switches on the send and return $V_{sense}$ lines (e.g., $V_{sense}1+$ 212 and $V_{sense1}-$ 214). The $V_{sense}$ switches can be controlled by a high-side driver 402 relay and a low-side driver 404 relay in the manner described above. Referring to FIGS. 9A-9D, schematics of drive controllers 900A, 900B, 900C, and 900D for controlling the high-side driver 402 and low-side driver 404 relays of $V_{sense}$ send line and $V_{sense}$ return line switches are illustrated.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method comprising:
    determining, by a cycler coupled to each in a plurality of devices under test, a selection of a first device under test from the plurality of devices under test, which is connected to a load based at least on a closed high-side driver relay, coupled to a high-filter clock operating at a programmable first frequency, and a closed low-side driver relay, coupled to a low-filter clock operating at a programmable second frequency, of at least a first switch;
    based on the determination, deactivating, by the cycler, each remaining device under test in the plurality of devices under test such that only one device under test is active at a time;
    closing at a first rate, determined by the cycler based on the first frequency, the high-side driver relay of the first switch based at least on the received selection;
    closing at a second rate, determined by the cycler based on the second frequency, the low-side driver relay of the first switch based at least on the received selection, wherein the first rate and second rate are different.

2. The method of claim 1, further comprising:
    determining that a second device under test from the plurality of devices under test is connected to the load by a second switch;
    opening a high-side driver relay of the second switch and a low-side driver relay of the second switch, wherein the high-side driver relay and the low-side driver relay are opened based at least on the determination that the second device under test is connected to the load.

3. The method of claim 1, further comprising opening the high-side driver relay of the first switch at a first speed and opening the low-side driver relay of the first switch at a second speed different from the first speed such that the first rate, determined by the cycler using the first speed, and second rate, determined by the cycler using the second speed, determine an arc quenching time frame.

4. The method of claim 3, wherein the high-side driver relay of the first switch or the low-side driver relay of the switch but not both are open during the arc quenching time frame.

5. The method of claim 3, wherein both the high-side driver relay of the first switch and the low-side driver relay of the switch are open during the arc quenching time frame.

6. The method of claim 1, wherein the first device under test is selected automatically.

7. The method of claim 1, wherein the first device under test is selected manually.

8. The method of claim 1, wherein connecting to the load comprises connecting with the cycler.

9. An apparatus comprising:
    a power supply;
    a load;
    a plurality of switches, each switch comprising a high-side driver relay, coupled to a high-filter clock operating at a programmable first frequency, and a low side-driver relay, coupled to a low-filter clock operating at a programmable second frequency; and
    a cycler electrically connected to each in the plurality of switches,
    wherein the load and plurality of switches are part of a plurality of circuits,
    wherein a first switch in the plurality of switches corresponds to a first circuit in the plurality of circuits,
    wherein the first switch is closed when the high-side driver relay and the low-side driver relay of the first switch are closed,
    wherein the high-side driver relay of the first switch is closed at a first rate based at least on a selection of the first circuit, the first rate being determined by the cycler based at least on the first frequency, wherein the low-side driver relay of the first switch is closed at a second rate, the second rate being determined by the cycler based at least on the second frequency such that, the first and second rates are different,
    wherein the first circuit is completed based at least on the first switch being closed, and
    wherein, based at least on the selection of the first circuit by the cycler, each remaining switch in the plurality of switches is turned off such that only one switch in the plurality of switches is active at a time.

10. The apparatus of claim 9, further configured to:
    determine that a second circuit in the plurality of circuits is completed;
    open a high-side driver relay of a second switch and a low-side driver relay of the second switch, wherein the high-side driver relay and the low-side driver relay are opened based at least on the determination that the second circuit is completed.

11. The apparatus of claim 9, wherein the high-side driver relay of the first switch is opened at a first speed and the low-side driver relay of the first switch is opened at a second speed different from the first speed such that the first rate, determined by the cycler using the first speed, and second rate, determined by the cycler using the second speed, determine an arc quenching time frame.

12. The apparatus of claim 11, wherein each of the plurality of circuits is incomplete during the arc quenching time frame such that a high-side driver relay of each switch or a low-side driver relay of each switch, but not both, in the plurality of switches corresponding to the plurality of circuits are open.

13. The apparatus of claim 11, wherein a high-side driver relay of each switch and a low-side driver relay of each switch in the plurality of switches corresponding to the plurality of circuits are open.

14. The apparatus of claim 9, wherein the first circuit is selected automatically.

15. The apparatus of claim 9, wherein the first circuit is selected manually.

16. The apparatus of claim 9, wherein the cycler comprises the load and the power supply.

* * * * *